(12) United States Patent
French et al.

(10) Patent No.: US 8,274,129 B2
(45) Date of Patent: Sep. 25, 2012

(54) POWER TRANSISTOR WITH IMPROVED HIGH-SIDE OPERATING CHARACTERISTICS AND REDUCED RESISTANCE AND RELATED APPARATUS AND METHOD

(75) Inventors: William French, San Jose, CA (US);
Peter Smeys, Mountain View, CA (US);
Peter J. Hopper, San Jose, CA (US);
Peter Johnson, Sunnyvale, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 208 days.

(21) Appl. No.: 12/589,491

(22) Filed: Oct. 23, 2009

(65) Prior Publication Data
US 2011/0095365 A1 Apr. 28, 2011

(51) Int. Cl.
*H01L 23/58* (2006.01)
(52) U.S. Cl. .. 257/492; 257/335; 257/493; 257/E29.256
(58) Field of Classification Search .................. 257/335, 257/347, 454, 492, 493, E29.268, E21.427, 257/E29.066, E29.256; 438/311, 151, 479
See application file for complete search history.

(56) References Cited

U.S. PATENT DOCUMENTS

| 6,118,152 | A  | * | 9/2000 | Yamaguchi et al. | 257/347 |
| 6,346,451 | B1 | * | 2/2002 | Simpson et al. | 438/311 |
| 6,468,878 | B1 | * | 10/2002 | Petruzzello et al. | 438/454 |
| 6,703,684 | B2 |   | 3/2004 | Udrea et al. | |
| 2004/0108549 | A1 | | 6/2004 | Denison | |
| 2006/0091503 | A1 | | 5/2006 | Wu et al. | |
| 2007/0045767 | A1 | | 3/2007 | Zhu et al. | |
| 2009/0152668 | A1 | | 6/2009 | Sone et al. | |

OTHER PUBLICATIONS

Notification of Transmittal of the International Search Report and the Written Opinion of the International Searching Authority, or the Declaration dated Jun. 17, 2011 in connection with International Patent Application No. PCT/US2010/053348.

* cited by examiner

*Primary Examiner* — David Vu
(74) *Attorney, Agent, or Firm* — Eugene C. Conser; Wade J. Brady, III; Frederick J. Telecky, Jr.

(57) ABSTRACT

A method includes forming a transistor device on a first side of a semiconductor-on-insulator structure. The semiconductor-on-insulator structure includes a substrate, a dielectric layer, and a buried layer between the substrate and the dielectric layer. The method also includes forming a conductive plug through the semiconductor-on-insulator structure. The conductive plug is in electrical connection with the transistor device. The method further includes forming a field plate on a second side of the semiconductor-on-insulator structure, where the field plate is in electrical connection with the conductive plug. The transistor device could have a breakdown voltage of at least 600V, and the field plate could extend along at least 40% of a length of the transistor device.

6 Claims, 9 Drawing Sheets

POWER TRANSISTOR WITH IMPROVED HIGH-SIDE OPERATING CHARACTERISTICS AND REDUCED RESISTANCE AND RELATED APPARATUS AND METHOD

TECHNICAL FIELD

This disclosure relates generally to semiconductor devices. More specifically, this disclosure relates to a power transistor with improved high-side operating characteristics and reduced resistance and related apparatus and method.

BACKGROUND

Laterally Diffused Metal Oxide Semiconductor (LDMOS) transistors are commonly used in applications such as radio frequency (RF) and microwave power amplifiers. These transistors are often fabricated using an epitaxial silicon layer deposited on a more highly-doped silicon substrate. Either diffused sinkers or trenches etched through the epitaxial layer are then typically used to ground sources of the transistors to the substrate.

BRIEF DESCRIPTION OF THE DRAWINGS

For a more complete understanding of this disclosure and its advantages, reference is now made to the following description, taken in conjunction with the accompanying drawings, in which.

DETAILED DESCRIPTION OF THE INVENTION

FIGS. 1 through 16, discussed below, and the various embodiments used to describe the principles of the present invention in this patent document are by way of illustration only and should not be construed in any way to limit the scope of the invention. Those skilled in the art will understand that the principles of the invention may be implemented in any type of suitably arranged device or system.

Figure 1:
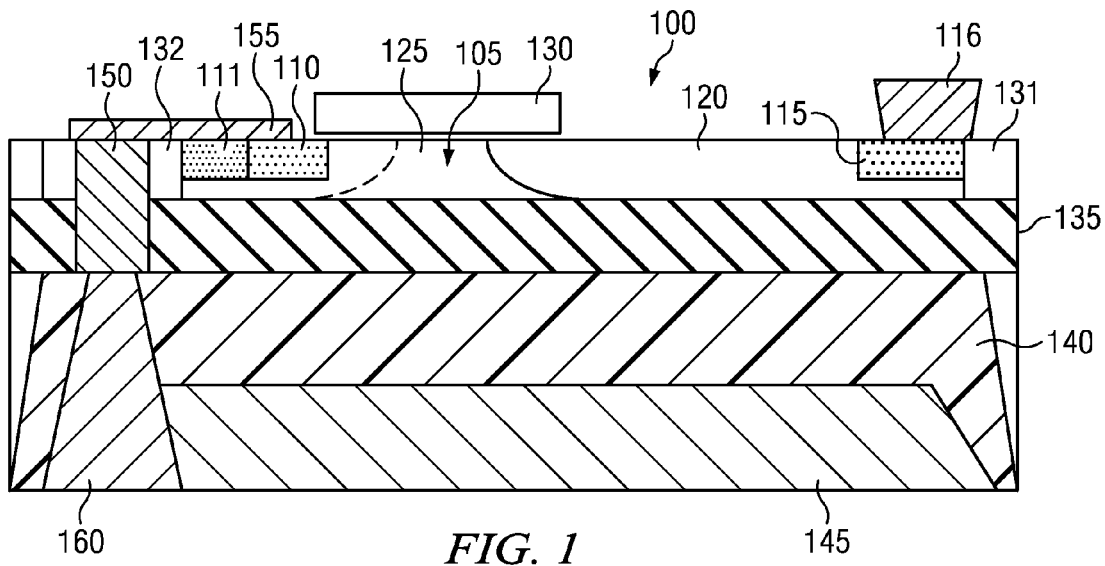
FIG. 1 illustrates an example power transistor according to this disclosure.

FIG. 1 illustrates an example power transistor 100 according to this disclosure. The embodiment of the power transistor 100 shown in FIG. 1 is for illustration only. Other embodiments of the power transistor 100 could be used without departing from the scope of this disclosure.

As shown in FIG. 1, the power transistor 100 represents a Laterally Diffused Metal Oxide Semiconductor (LDMOS) transistor device that includes a substrate 105, such as a P– silicon substrate. Two doped regions 110-111 are formed in the substrate 105, such as a P+ doped source region and an N+ doped region, respectively. A doped drain region 115, such as an N+ doped region, and a drift region 120 are also formed in the substrate 105. The drain region 115 is in electrical contact with a drain contact 116. The drift region 120 is used to drop voltage between the drain region 115 and a channel region 125. The power transistor 100 also includes a gate 130, which could be formed from polysilicon and which is typically separated from the substrate 105 by a gate oxide. Two trenches 131-132 can be used to help electrically isolate the power transistor 100.

The drift region 120 in this example can be configured to increase or maximize a drain-to-source specific-on resistance ($RDS_{ON,SP}$) of the power transistor 100. For example, the drift region 120 can be dimensioned to have a thickness of approximately 0.45 μm and a length of 40 μm. Also, in some embodiments, the drift region 120 could include a linearly graded doping profile which means that the electric field inside the drift region 120 is generally constant.

The power transistor 100 further includes a buried oxide layer 135, a dielectric layer 140, a field plate 145, a plug 150 with a source contact 155, and a plug 160. The buried oxide layer 135 can be dimensioned to be substantially thin, such as between 0.4 μm and 1 μm. The dielectric layer 140 can be a polymer such as, for example, SU8 photoresist or other epoxy-based material. In particular embodiments, the dielectric layer 140 has a thickness of 4 μm. The field plate 145 could represent a copper plate electroplated to a backside of the dielectric layer 140 or other conductive structure. The field plate 145 is electrically coupled to the front side of the power transistor 100 through the plug 150 (which could represent a tungsten plug) and the plug 160 (which could represent a copper plug). The plug 150 can be electrically coupled to the source contact 155, which could be formed from aluminum. The plug 150 can be configured to decrease or minimize a metal component of the drain-to-source on-resistance ($RDS_{ON}$) of the power transistor 100. In this example, a high-voltage LDMOS transistor with a breakdown voltage greater than 600V can be created by, among other things, the buried oxide layer 135 producing an enhanced reduced surface field (RESURF) effect. Also, the field plate 145 can enable a "source-high" circuit configuration and act as a backside plate.

Although FIG. 1 illustrates one example of a power transistor 100, various changes may be made to FIG. 1. For example, while certain components of FIG. 1 have been described above as being formed from particular materials, each component in the power transistor 100 could be formed from any suitable material(s) and in any suitable manner. Also, the relative sizes and shapes of the components in FIG. 1 are for illustration only.

Figure 2:
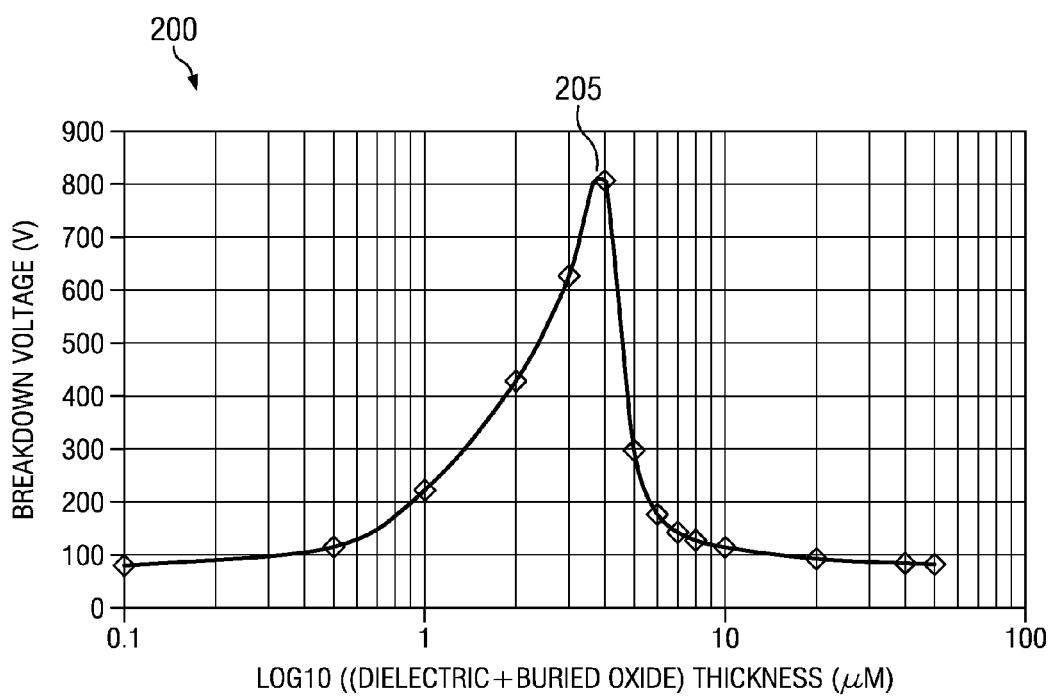
FIGS. 2 and 3 illustrate example graphs showing different relationships involving the power transistor according to this disclosure.
Figure 3:
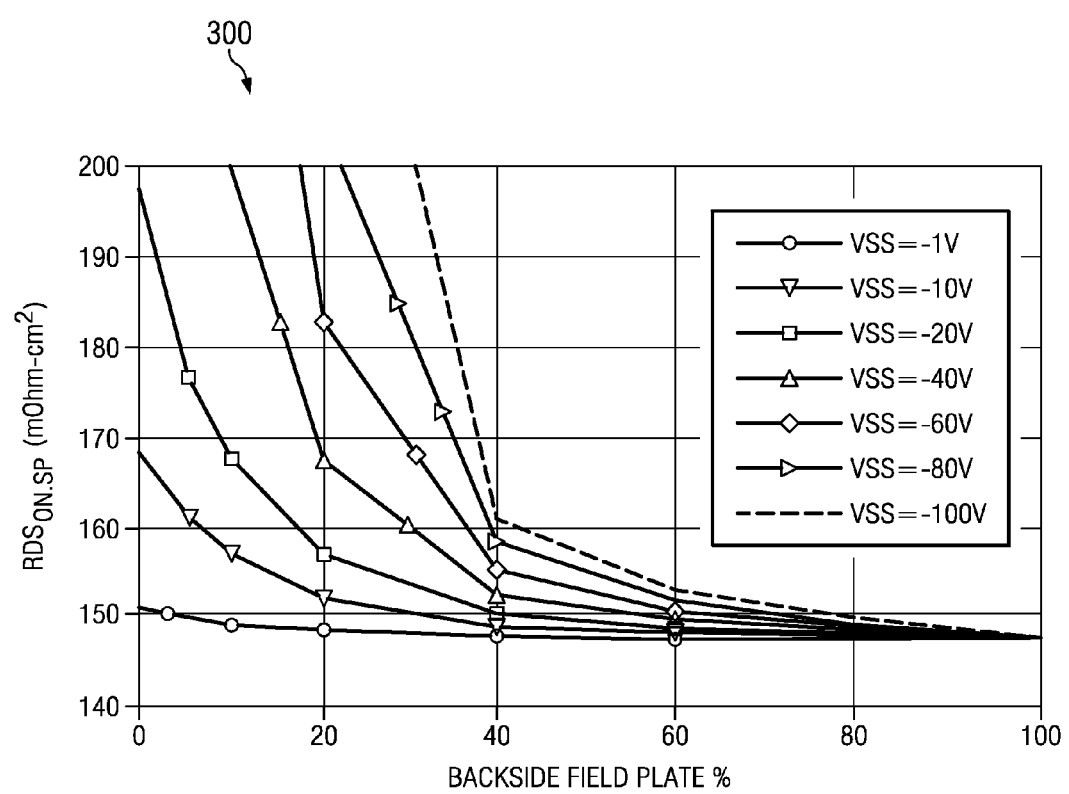

FIGS. 2 and 3 illustrate example graphs 200 and 300 showing different relationships involving the power transistor 100 according to this disclosure. The graphs shown in FIGS. 2 and 3 are for illustration only. Other transistors having different relationships could also be used without departing from the scope of this disclosure.

As shown in FIG. 2, the graph 200 illustrates the breakdown voltage versus the dielectric layer thickness in the power transistor 100. The dielectric layer 140 of the power transistor 100 can be configured to vary the breakdown voltage of the power transistor 100. For a dielectric layer 140 with a small thickness, the breakdown voltage can be very low. As the dielectric layer 140 increases in thickness, the breakdown voltage increases up to a threshold point 205, at which point the breakdown voltage drops substantially as the thickness of the dielectric layer 140 continues to increase.

This behavior could possibly be explained as follows. In this device there are many complex effects that compete to determine the breakdown voltage, two of which are:

(1) a normal depletion of the pn junction diode across regions 125 and 120; and (2) a RESURF action from the substrate 145 to the drift region 120 (for example, ndrift layer) which acts to deplete the drift region 120 at which point a uniform potential gradient across this region is created which will be the maximum breakdown voltage As the drain voltage is increased, the depletion region across drift region 120 and channel region 125 will increase. At the same time the RESURF effect from the substrate acts to begin to deplete the drift region 120. With a small dielectric layer 140 thickness, however, the lateral distribution of potential is still non-ideal and high electric fields build up at the interface between the drain region 115 and drift region 120 interface. The breakdown voltage is limited to a low value as a result. By increasing the dielectric layer 140 thickness, the distribution of potential lines becomes more uniform until the optimum is reached and hence a peak breakdown voltage is reached. Increasing the dielectric layer 140 thickness further causes a very weak RESURF effect and thereby a non-ideal distribution of potential lines and a low breakdown voltage is again achieved.

In some embodiments, a breakdown voltage of approximately 700V can be achieved with a dielectric layer 140 formed from SU8 with a thickness of approximately 4 µm and a buried oxide layer 135 with a thickness between approximately 0.4 µm and approximately 1 µm. If the dielectric layer 140 is formed from one or more other dielectric materials, the dielectric layer 140 could have a different thickness that corresponds to the 700V breakdown voltage. Note that other dielectric materials could have a different maximum breakdown voltage that is less than or greater than 700V.

As shown in FIG. 3, a graph 300 illustrates the effect of extending the field plate 145 on the drain-source specific-on resistance of the power transistor 100. As noted above, the field plate 145 is coupled to the source contact 155 through the plugs 150 and 160 in the power transistor 100. The field plate 145 can be extended across the backside of the power transistor 100 underneath the drift region 120 in order to reduce or eliminate a source-substrate coupling effect.

As shown in FIG. 3, the length of the field plate 145 across the backside of the power transistor 100 can affect the drain-source specific-on resistance of the power transistor 100 as the substrate potential is changed. For example, the graph 300 illustrates substrate potentials of −1V, −10V, −20V, −40V, −60V, −80V, and −100V. The drain-source specific-on resistance decreases as the length of the field plate 145 increases. When the field plate 145 is less than 40% of the total length of the power transistor 100, the drain-source specific-on resistance becomes significantly higher as the substrate potential (source voltage) increases. However, as the field plate 145 is extended across the backside of the power transistor 100 to a larger extent, the drain-source specific-on resistance becomes less dependent on the substrate bias and can approach or reach a minimum value at some point (typically between 60% and 100%).

The power transistor 100 can be configured to allow a conductive interconnect portion of the drain-source specific-on resistance to be reduced or minimized by allowing current to be extracted through the backside of the power transistor 100. The source region component of the drain-source specific-on resistance can be reduced or minimized as a result of a thick field plate 145. The drain region component of the drain-source specific-on resistance can be reduced or minimized because, with the source now on the backside, more layout area is available for the drain contact 116.

Although FIGS. 2 and 3 illustrate examples of graphs 200 and 300 showing different relationships involving the power transistor 100, various changes may be made to FIGS. 2 and 3. For example, the relationships shown in the graphs 200 and 300 could vary with changes in the composition or structure of the power transistor 100.

Figure 4:
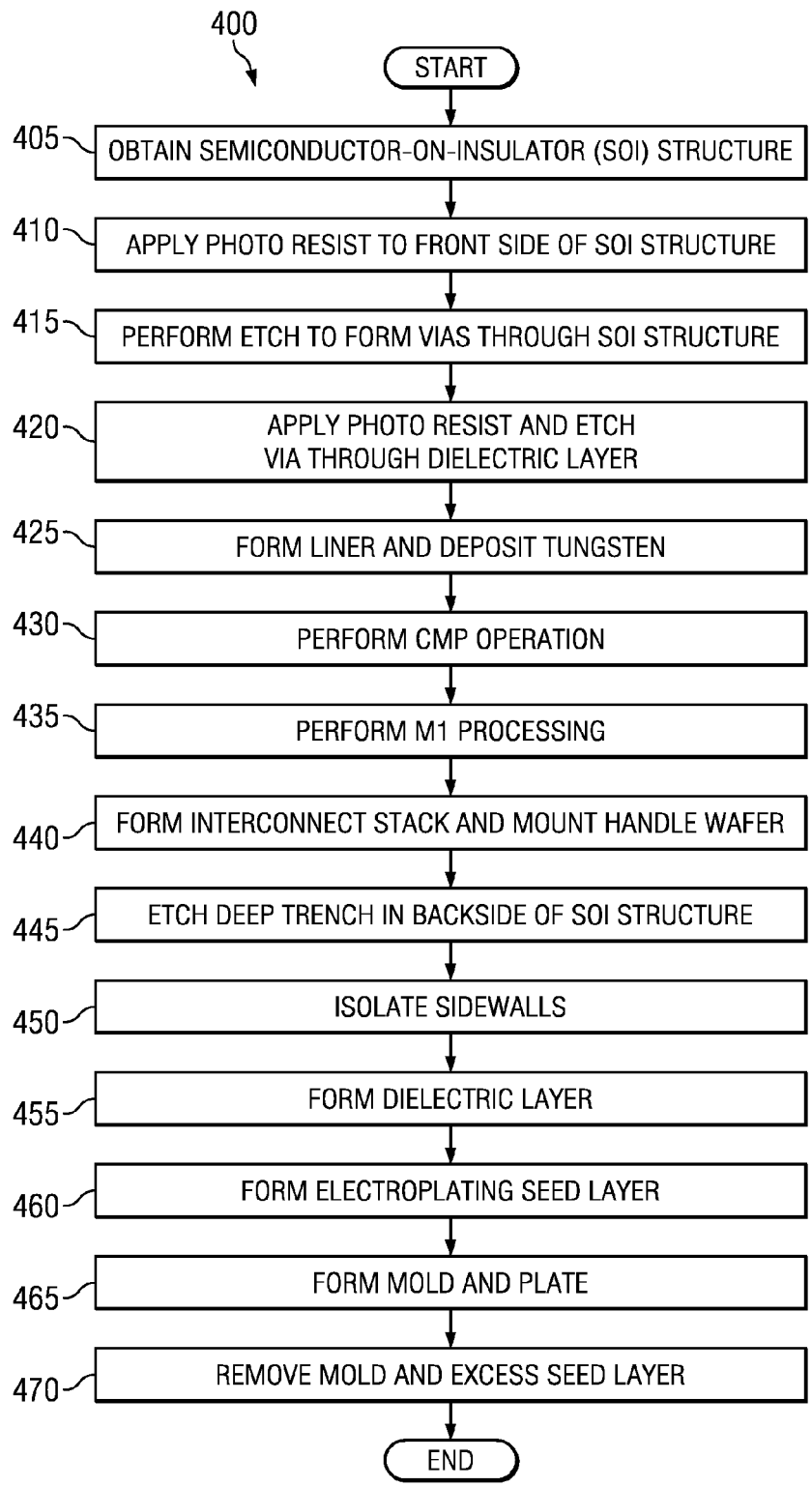
FIGS. 4 through 16 illustrate an example method and related structural details for manufacturing the power transistor according to this disclosure.

FIGS. 4 through 16 illustrate an example method and related structural details for manufacturing the power transistor 100 according to this disclosure. In particular, FIG. 4 illustrates an example method 400 for manufacturing the power transistor 100, and the description of FIG. 4 makes reference to FIGS. 5 through 16 that illustrate structural details associated with the method 400. The embodiments of the method 400 and related structural details shown in FIGS. 4 through 16 are for illustration only. Other embodiments of the method 400 and related structural details could be used without departing from the scope of this disclosure.

Figure 5:
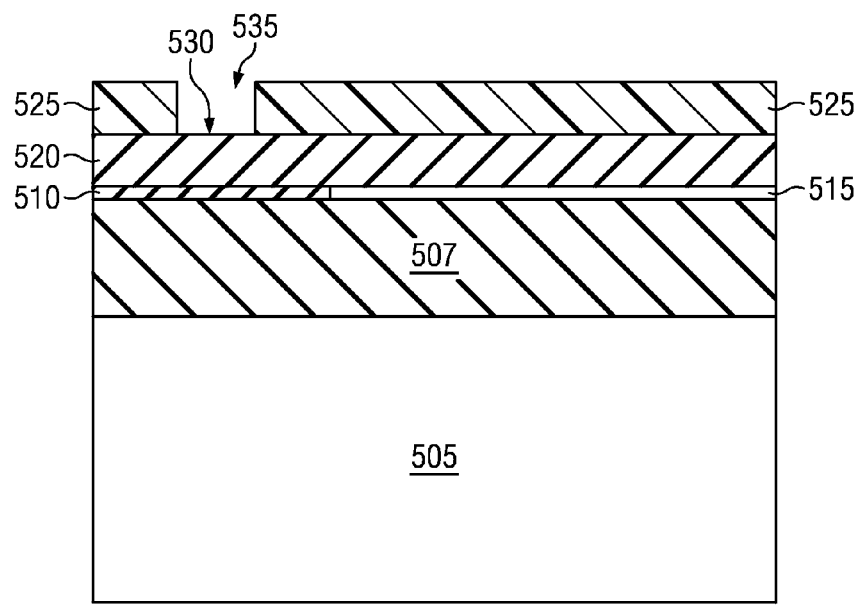

As shown in FIG. 4, the method 400 commences at step 405, where a semiconductor-on-insulator (SOI) structure is manufactured or otherwise obtained. As shown in FIG. 5, the SOI structure can be formed by taking a semiconductor substrate 505 and depositing or otherwise forming a buried oxide layer 507. In particular embodiments, the semiconductor substrate 505 is 750 µm thick. Additionally, a field oxide layer 510 and a silicon layer 515 (which functions as the substrate for a later-formed transistor) are deposited or otherwise formed on the buried oxide layer 507, both of which could be approximately 0.45 µm thick. At this point, additional structures can be formed to complete formation of a transistor device, such as by forming a source, gate, drain, and drift region for an LDMOS transistor device (not shown). Standard LDMOS processing continues until the LDMOS transistor device is formed along with the first level backend dielectric layer 140. In some embodiments such a combination of poly and first inter-metal dielectric could be approximately 0.7 µm thick above the field oxide layer 510 and the silicon layer 515. In step 410, a photo resist layer 525 is applied to the front side 530 of the SOI structure as shown in FIG. 5. The photo resist layer 525 includes a pattern having an opening 535. The opening 535 can be formed by patterning the photo resist layer 525 using a suitable exposure.

Figure 6:
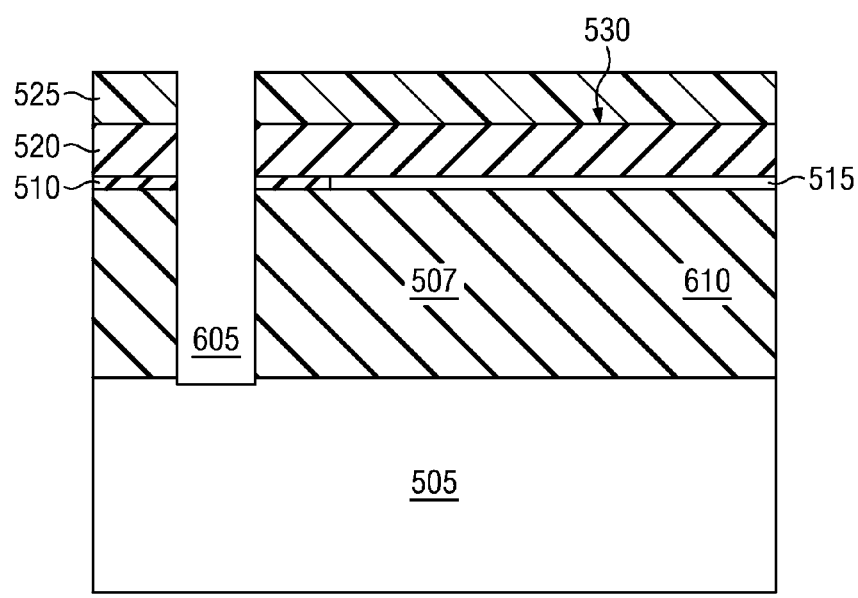

In step 415, an etch is performed to form via 605 extending from the front side 530 of the SOI structure to the silicon substrate 505 as shown in FIG. 6. It will be understood that although only one via 605 is illustrated as being formed, the process can include more than one via 605 formed in the SOI structure. The etch could represent a very short LAM etch process. As shown in FIG. 6, the via 605 is formed through the dielectric layer 520, the field oxide layer 510 or the silicon layer 515, and the buried oxide layer 507. In particular embodiments, the via 605 can be 1 µm wide and 4 µm deep. In some embodiments, the photo resist layer 525 can be removed (such as by stripping) after the etch is performed so that substantially no portion of the photo resist layer 525 remains on the SOI structure.

Figure 7:
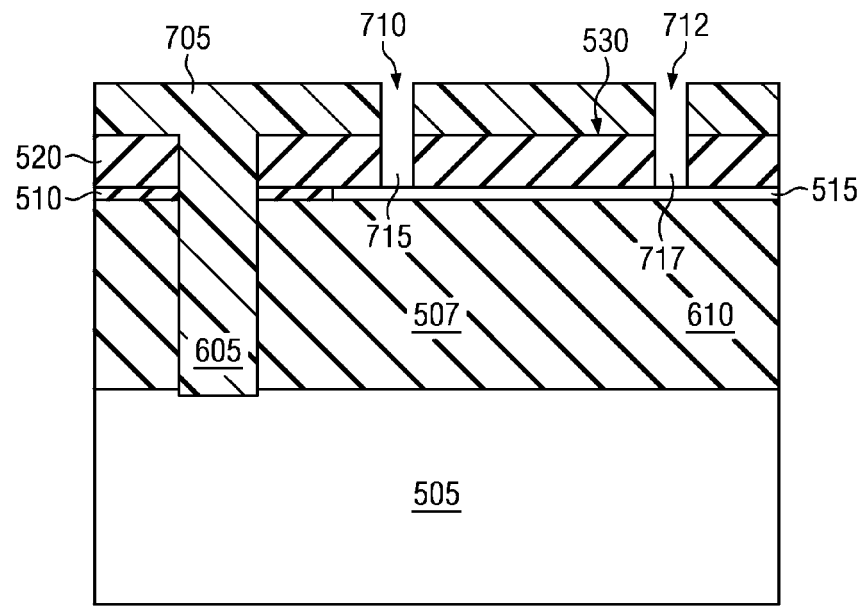

In step 420, another photo resist layer 705 is applied over the SOI structure as shown in FIG. 7. The photo resist layer 705 covers the dielectric layer 520 and fills the via 605. The photo resist layer 705 could be formed in any suitable manner and using any suitable material(s). As shown in FIG. 7, the photo resist layer 705 defines a second and third openings 710, 712. In particular embodiments, each of the openings 710 can be 0.5 µm wide. Thereafter, an etch process is performed to form a vias 715, 717 through the dielectric layer 520. The etch could represent a very short LAM etch process.

Figure 8:
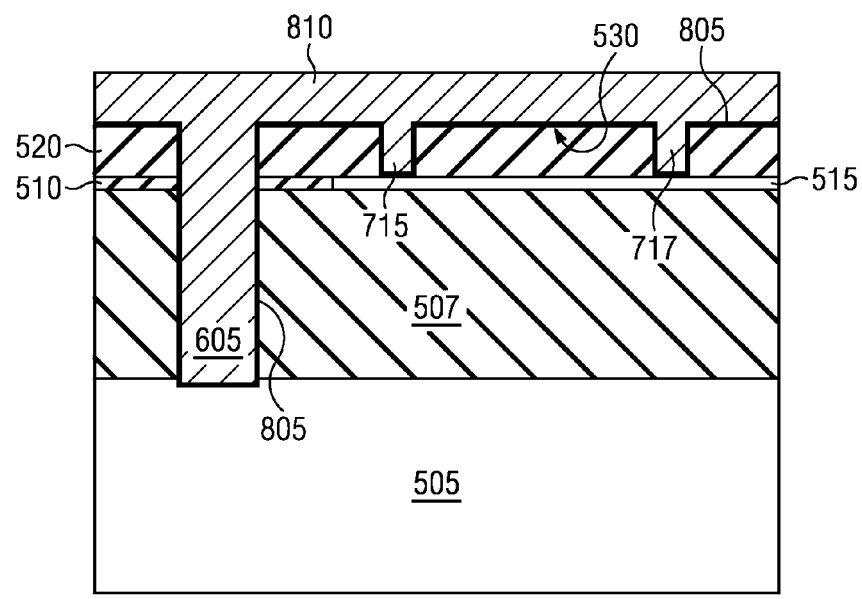

In step 425, a liner 805 and a tungsten layer 810 are formed over the front side 530 of the SOI structure as shown in FIG. 8. The liner 805 could be formed from any suitable material(s) and in any suitable manner. The tungsten layer 810 could be formed in any suitable manner, such as by using a chemical vapor deposition (CVD) process. The tungsten layer 810 could rise approximately 0.6 μm above the top of the dielectric layer 520.

Figure 9:
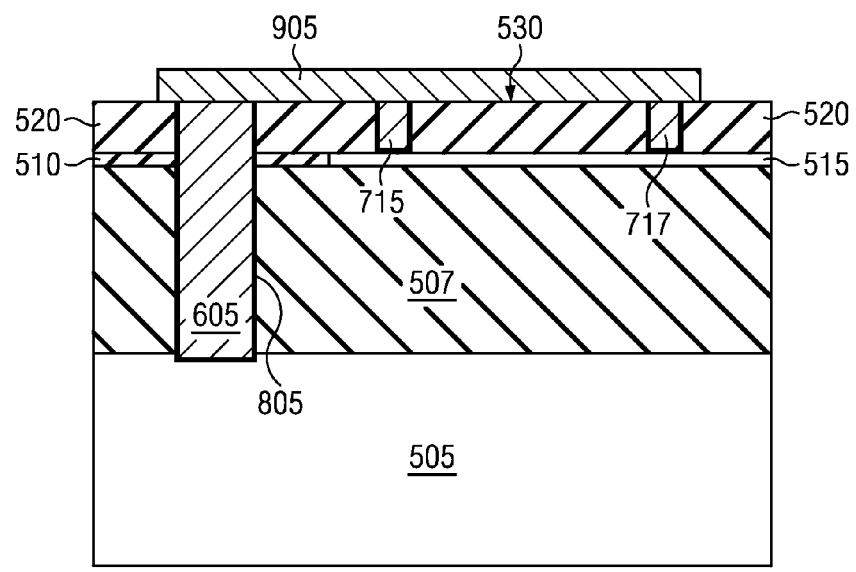

In step 430, a chemical mechanical polishing (CMP) operation is performed to planarize the tungsten layer 810. This is shown in FIG. 9, where the tungsten layer 810 has been removed over the dielectric layer 520 but remains within the vias 605, 715, 717. In step 435, a photolithography and etch process, a single damascene process, or other process can be employed to pattern and form first metal or "M1" wires or plates. FIG. 9 illustrates an example of this, where M1 wires 905 are formed on the front side 530 of the SOI structure over the vias 605, 715, 717. A cleaning step, such as another CMP process, can be performed to remove excess conductive material used to form the M1 wires or plates.

Figure 10:
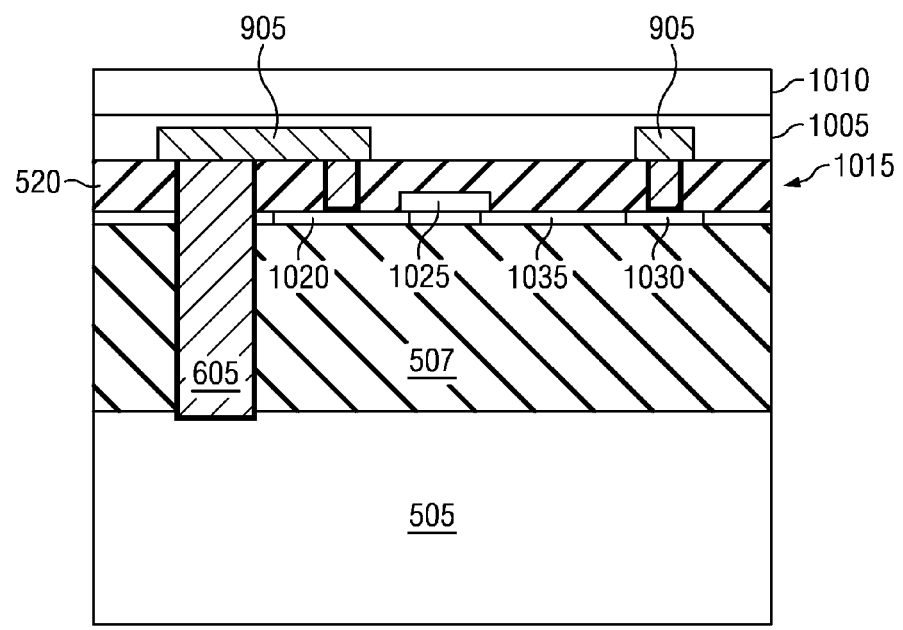

In step 440, an interconnect stack and handle wafer are mounted or otherwise formed on the completed transistor device. As shown in FIG. 10, an interconnect stack 1005 could include a dielectric layer, second metal (M2) layer, passivation layer, or any other or additional layer(s). A handle wafer 1010, such as one with a thickness of 750 μm, is mounted over the interconnect stack 1005. Note that the source 1020, gate 1025, drain 1030, and drift region 1035 are shown in the silicon layer 515 of the SOI structure.

Figure 11:
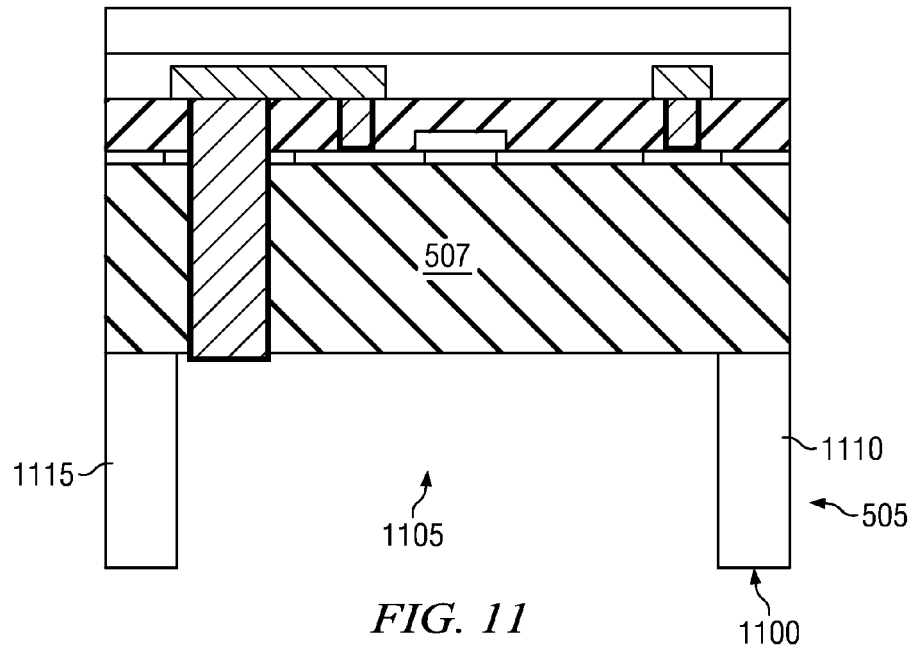

In step 445, a deep trench is etched in the backside of the SOI structure as shown in FIG. 11. For example, another photo resist layer can be applied to the backside 1100 of the SOI structure. The photo resist layer could be formed in any suitable manner and using any suitable material(s). The photo resist layer defines a deep trench area 1105. An etch process can be performed to form the deep trench 1105 and sidewalls 1110, 1115 in the substrate 505. The etch process could include a Bosch etch process between 10 μm and 30 μm, followed by a chemical etch performed selectively to the buried oxide layer 507. In some embodiments, the Bosch etch could be more than 30 μm, such as, for example, 200 μm.

Figure 12:
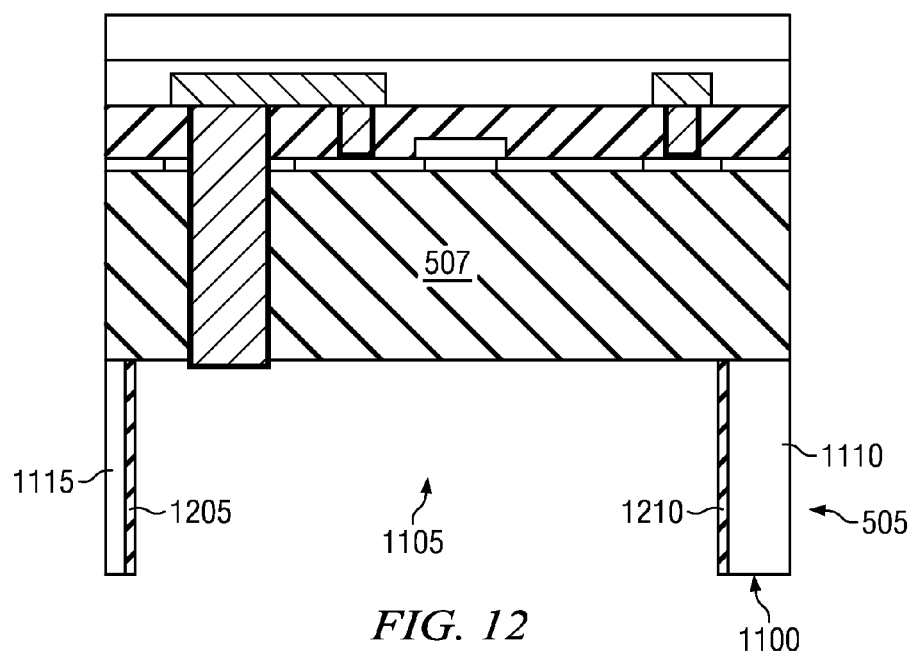

In step 450, a sidewall dielectric deposition and etch process is applied to the sidewalls 1110, 1115 for isolation as shown in FIG. 12. The sidewall dielectric deposition and etch process 1205, 1210 isolates the sidewalls 1110, 1115 of the deep trench 1105 during subsequent process steps.

Figure 13:
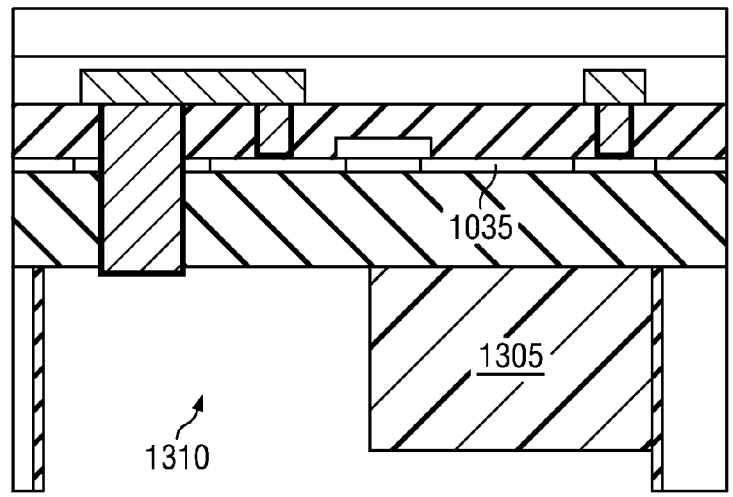

In step 455, a dielectric layer 1305 is formed in the deep trench 1105 under the drift region 1035 as shown in FIG. 13. The dielectric layer 1305 can be a polymer, such as an SU8 material, that is sprayed on and exposed to build up the dielectric layer. The SU-8 layer is deposited into a portion of the deep trench 1105 and then a photo-resist mask is used to expose only the required portion of the SU8, leaving a remaining deep trench 1310 that is unfilled. In particular embodiments, the SU8 material can be approximately 4 μm thick. Also, in particular embodiments, the remaining deep trench 1310 can be approximately 200 μm wide.

Figure 14:
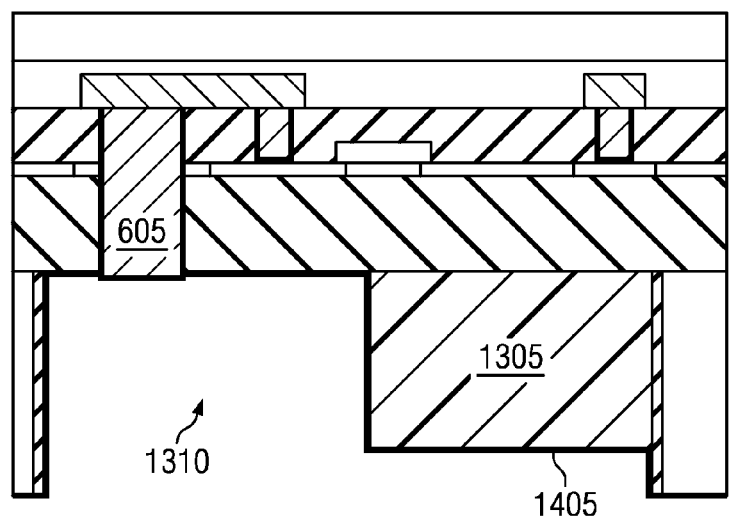

In step 460, an electroplating seed layer 1405 is formed, such as by sputtering, over the dielectric layer 1305 and in the deep trench 1310 as shown in FIG. 14. At least a portion of the electroplating seed layer 1405 is proximate to the filled via 605. In other embodiments, a conductive plug (not specifically illustrated) is mounted or otherwise formed in electrical contact with the filled via 605, and the electroplating seed layer 1405 is in electrical contact with the conductive plug.

Figure 15:
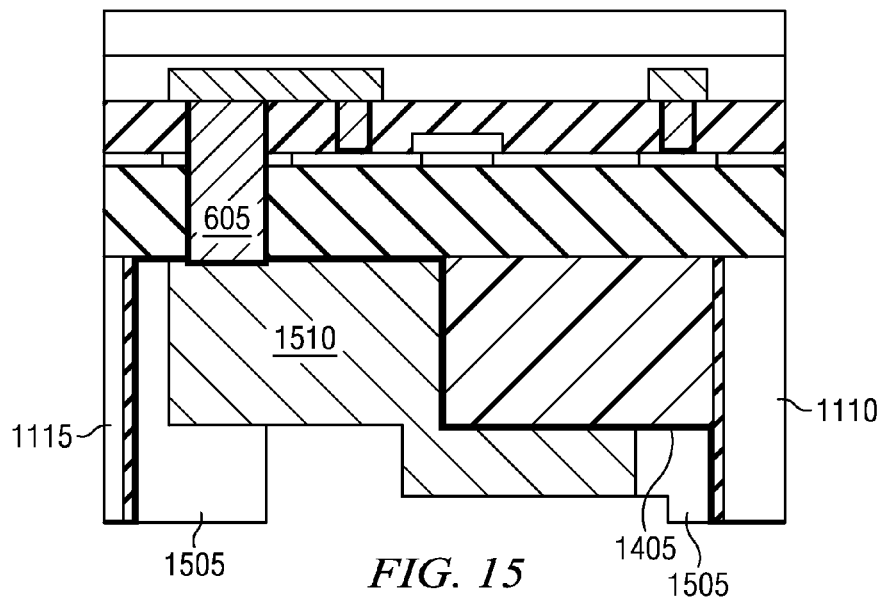
Figure 16:
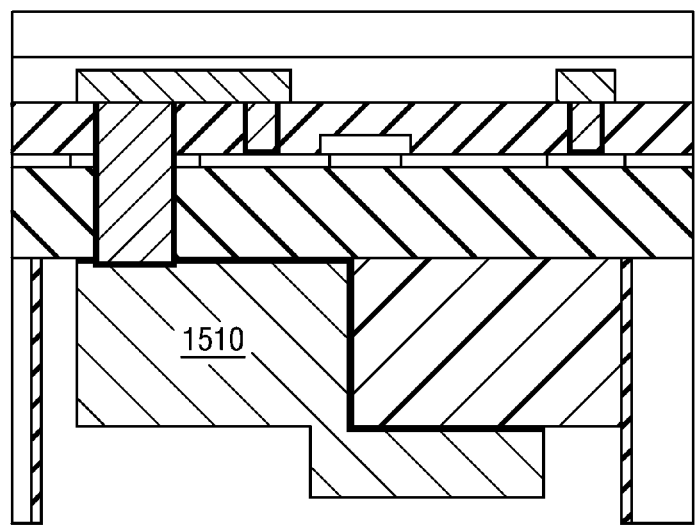

In step 465, an electroplate mold 1505 is formed, and electroplating is performed to form a field plate 1510 as shown in FIG. 15. The electroplate mold 1505 is configured to establish dimensions for the field plate 1510. Also, the electroplate mold 1505 is configured to allow the formation of the field plate 1510 in contact with the filled via 605. As shown in FIG. 15, the electroplate mold 1505 is formed along the sidewalls 1110 and 1115. Thereafter, an electric field or current can be applied to the electroplating seed layer 1405 to form a layer of conductive material within the electroplate mold 1505, which forms the field plate 1510. After electroplating is performed, the electroplate mold 1505 and excess seed layer 1405 can be removed in step 470. FIG. 16 illustrates an example of the resulting structure, which represents a completed power transistor.

Although FIGS. 4 through 16 illustrate one example of a method 400 and related structural details for manufacturing the power transistor 100, various changes may be made to FIGS. 4 through 16. For example, while these figures illustrate example structures at different manufacturing stages, various techniques can be used to form the power transistor 100. As a result, one or more steps could be omitted, modified, or rearranged and additional steps could be added in FIG. 4. Also, various modifications could be made to the structures shown in FIGS. 5 through 16. Further, while certain components have been described above as being formed from particular materials, each component could be formed from any suitable material(s) and in any suitable manner. In addition, the relative sizes and shapes of the components are for illustration only. Additionally, the processes and techniques disclosed herein can apply equally to either N or P LDMOS transistors.

It may be advantageous to set forth definitions of certain words and phrases that have been used within this patent document. Terms and phrases such as "above," "below," "front side," and "backside" when used with reference to the drawings simply refer to aspects of certain structures when viewed at particular directions and are not limiting. The term "couple" and its derivatives refer to any direct or indirect communication between two or more components, whether or not those components are in physical contact with one another. The terms "include" and "comprise," as well as derivatives thereof, mean inclusion without limitation. The term "or" is inclusive, meaning and/or. The phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, have a relationship to or with, or the like.

Although the present disclosure has been described with an exemplary embodiment, various changes and modifications may be suggested to one skilled in the art. It is intended that the present disclosure encompass such changes and modifications as fall within the scope of the appended claims.

What is claimed is:

1. An apparatus comprising:
   a semiconductor-on-insulator structure comprising:
   a substrate;
   a field plate;
   a buried layer between the substrate and the field plate; and
   a dielectric layer between the field plate and the buried layer; and
   a transistor device at least partially formed in the substrate, the transistor device comprising a source region, a drain region, and a drift region in the substrate; and
   at least one plug through the dielectric layer, the buried layer, and the substrate, the at least one plug configured to electrically couple the field plate to the source region of the transistor device;
   wherein the transistor device has a breakdown voltage of at least 600 V;

also wherein the dielectric layer has a thickness of approximately 4 µm; and
the buried layer has a thickness between approximately 0.4 µm and approximately 1 µm;
also wherein the field plate extends along at least 40% of a length of the transistor device.

2. The apparatus of claim 1, further comprising:
a source contact formed on the substrate and configured to electrically connect the at least one plug to the source region of the transistor device.

3. The apparatus of claim 1, wherein:
the substrate comprises silicon;
the field plate comprises copper;
the buried layer comprises oxide;
the dielectric layer comprises a polymer; and
the at least one plug comprises a copper plug and a tungsten plug.

4. A power amplifier comprising a Laterally Diffused Metal Oxide Semiconductor (LDMOS) transistor, the LDMOS transistor comprising:
a substrate;
a source region, a drain region, and a drift region in the substrate;
a field plate;
a buried layer between the substrate and the field plate; and
a dielectric layer between the field plate and the buried layer; and
the LDMOS transistor further comprises at least one plug through the dielectric layer, the buried layer, and the substrate, the at least one plug configured to electrically couple the field plate to the source region of the transistor device;
wherein the LDMOS transistor has a breakdown voltage of at least 600 V:
the dielectric layer has a thickness of approximately 4 µm; and
the buried layer has a thickness between approximately 0.4 µm and approximately 1 µm; and
the field plate extends alone at least 40% of a length of the LDMOS transistor.

5. The power amplifier of claim 4, wherein the LDMOS transistor further comprises:
a source contact formed on the substrate and configured to electrically connect the at least one plug to the source region of the LDMOS transistor.

6. The power amplifier of claim 4, wherein:
the substrate comprises silicon;
the field plate comprises copper;
the buried layer comprises oxide;
the dielectric layer comprises a polymer; and
the at least one plug comprises a copper plug and a tungsten plug.

* * * * *